United States Patent
Cho et al.

(10) Patent No.: US 9,443,569 B2
(45) Date of Patent: Sep. 13, 2016

(54) DRIVER FOR A SEMICONDUCTOR MEMORY AND METHOD THEREOF

(71) Applicants: SK hynix Inc., Icheon (KR); Korea Advanced Institute of Science and Technology, Daejeon (KR)

(72) Inventors: Gyu Hyeong Cho, Daejeon (KR); Suk Hwan Choi, Daejeon (KR)

(73) Assignees: SK Hynix Inc., Icheon (KR); Korea Advanced Institute of Science and Technology, Daejeon (KR)

( * ) Notice: Subject to any disclaimer, the term of this patent is extended or adjusted under 35 U.S.C. 154(b) by 47 days.

(21) Appl. No.: 14/566,202

(22) Filed: Dec. 10, 2014

(65) Prior Publication Data

US 2015/0092501 A1 Apr. 2, 2015

Related U.S. Application Data

(62) Division of application No. 13/779,700, filed on Feb. 27, 2013, now Pat. No. 8,937,841.

(30) Foreign Application Priority Data

May 16, 2012 (KR) .......................... 10-2012-0052057
Jul. 6, 2012 (KR) .......................... 10-2012-0073758

(51) Int. Cl.
*G11C 5/14* (2006.01)
*G11C 7/12* (2006.01)
(Continued)

(52) U.S. Cl.
CPC . *G11C 7/12* (2013.01); *G11C 5/14* (2013.01); *G11C 5/145* (2013.01); *G11C 5/147* (2013.01); *G11C 13/0004* (2013.01);
(Continued)

(58) Field of Classification Search
CPC ............ G11C 5/14; G11C 5/147; G11C 7/12
USPC ............................... 365/189.09, 189.011, 203
See application file for complete search history.

(56) References Cited

U.S. PATENT DOCUMENTS 6,009,487 A * 12/1999 Davis .................. G06F 13/4072
326/30
7,948,793 B2 5/2011 Porter et al.
(Continued)

FOREIGN PATENT DOCUMENTS

KR 10-2010-0015195 A 2/2010

OTHER PUBLICATIONS

Young-Suk Son et al., "P-40: A Novel Data Driving Method and Circuits for AMOLED Displays", SID Symposium Digest of Technical Papers, Jun. 2006, pp. 343-346, vol. 37, Issue 1, Daejeon, Korea.

*Primary Examiner* — Viet Q Nguyen

(57) ABSTRACT

A driver for semiconductor memory, comprising: a storage unit configured to match and store a memory cell address and bucket charge current data corresponding to the memory cell address; a selection controller configured to receive the memory cell address and a target charge current data, and output a bucket charge current select signal and a target charge current select signal corresponding to the bucket charge current data and the target charge current data, respectively, by referring to the storage unit; and a current supply unit configured to supply a bucket charge current and a target charge current in response to the bucket charge current select signal and the target charge current select signal, respectively.

18 Claims, 11 Drawing Sheets

(51) Int. Cl.
*G11C 13/00* (2006.01)
*G11C 29/02* (2006.01)
(52) U.S. Cl.
CPC ...... *G11C 13/0007* (2013.01); *G11C 13/0038* (2013.01); *G11C 13/0069* (2013.01); *G11C 29/021* (2013.01); *G11C 29/028* (2013.01)

(56) References Cited

U.S. PATENT DOCUMENTS

| | | | |
|---|---|---|---|
| 8,334,796 B2 | 12/2012 | Wani et al. | |
| 8,669,511 B2* | 3/2014 | Doege | 250/214 R |
| 8,934,280 B1* | 1/2015 | Kuo | G11C 13/0069 365/145 |
| 8,937,841 B2* | 1/2015 | Cho | G11C 5/147 365/189.09 |
| 9,036,408 B1* | 5/2015 | Jurasek | G11C 13/004 365/163 |
| 9,286,976 B2* | 3/2016 | Lin | G11C 13/004 |
| 2003/0169241 A1* | 9/2003 | LeChevalier | G09G 3/3216 345/204 |
| 2007/0025146 A1 | 2/2007 | Huang | |
| 2008/0297216 A1* | 12/2008 | Chiang | G01R 31/3016 327/158 |
| 2009/0135651 A1* | 5/2009 | Kojima | G11C 16/26 365/185.16 |
| 2011/0118591 A1* | 5/2011 | Goetz | A61B 5/06 600/424 |
| 2011/0205791 A1 | 8/2011 | Porter et al. | |
| 2012/0134213 A1 | 5/2012 | Choi et al. | |
| 2012/0243295 A1* | 9/2012 | Sasaki | G11C 5/02 365/148 |
| 2013/0322154 A1* | 12/2013 | Youn | G11C 13/0002 365/148 |
| 2014/0233331 A1* | 8/2014 | Foong | G11C 13/0069 365/189.16 |

* cited by examiner

DRIVER FOR A SEMICONDUCTOR MEMORY AND METHOD THEREOF

CROSS-REFERENCE TO RELATED APPLICATIONS

The present application is a divisional of U.S. patent application Ser. No. 13/779,700, filed on Feb. 27, 2013, which claims priority of Korean Patent Application No. 10-2012-0052057, filed on May 16, 2012, and Korean Patent Application No. 10-2012-0073758, filed on Jul. 6, 2012, which are incorporated herein by reference in their entirety.

BACKGROUND

1. Field

Embodiments of the present invention relate to a driver for a semiconductor memory such as, for example, a memory cell of PRAM or ReRAM and a driving method thereof. More particularly, embodiments of the present invention relate to a driver for a semiconductor memory, which is capable of improving a write speed by instantly charging parasitic capacitance of each memory cell in the semiconductor memory, and a driving method thereof.

2. Description of the Related Art

As information and communication technology evolves at an increasingly faster rate, the need for a multi-media device capable of performing an interactive communication has started to emerge. For such a device, a semiconductor element having an ability of processing a large amount of information at a high speed is required. Key issues to performance improvement of the device include an ultra-high speed operation, an ultra-high integration density, and a power saving function of a memory element serving as a core part of the system. Particularly, the need for development of a nonvolatile memory device capable of accomplishing the ultra-high integration density has been gradually increasing. A conventional DRAM has a unit cell having a 1-transistor/1-capacitor structure. However, as a size of the unit cell decreases to increase an integration density, it has become increasingly difficult to fabricate the conventional DRAM memory while maintaining a high yield. As a result, the need for developing a new type of a nonvolatile memory to replace the conventional DRAM arises.

Various types of next-generation memories are currently under development to combine characteristics of a high integration density and low power consumption of DRAM with a nonvolatile characteristic of flash memory and a high-speed operation characteristic of SRAM. For instance, the next-generation memories may include phase change RAM (PRAM), nano floating gate memory (NFGM), resistance RAM (ReRAM), polymer RAM (PoRAM), and magnetic RAM (MRAM). However, in the PRAM and PoRAM, since parasitic capacitance may exist in each cell and wiring elements connected to the cell, a write delay may occur. The write delay impedes a high-speed write operation.

In order to resolve the write delay issue, a conventional current driving method has been used. In the conventional current driving method, a charge current is instantly provided to pre-charge parasitic capacitance, thereby reducing a data writing time.

However, this conventional method is highly likely to result in a voltage overshoot or the like during the pre-charge process. On the other hand, when the voltage overshoot is intended to be prevented, it is difficult to obtain a desired data write speed.

SUMMARY

Various embodiments are directed to a driver for a semiconductor memory which is capable of improving a write speed and a method thereof, in a driving device and method for writing data into a semiconductor memory such as a memory cell such as, for example, PRAM or ReRAM according to the current driving method.

In an embodiment, a driver for a semiconductor memory includes: a storage unit configured to match and store a memory cell address and bucket charge current data corresponding to the memory cell address; a selection controller configured to receive the memory cell address and target charge current data and output a bucket charge current select signal corresponding to the bucket charge current data and a target charge current select signal corresponding to the target charge current data by referring to the storage unit; and a current supply unit configured to supply a bucket charge current and a target charge current in response to the bucket charge current select signal and the target charge current select signal, respectively.

The driver may further include a bucket charge current setting unit configured to set the bucket charge current data stored in the storage unit with respect to each memory cell address.

In another embodiment, a method of a driver for a semiconductor memory includes: selecting bucket charge current data based on an inputted memory cell address and target charge current data; outputting a target charge current select signal and a bucket charge current select signal corresponding to the target charge current data and the bucket charge current data, respectively; providing a bucket charge current to the memory cell corresponding to the memory cell address to pre-charge the memory cell in response to the bucket charge current select signal; and providing a target charge current to the memory cell corresponding to the memory cell address in response to the target charge current select signal.

In another embodiment, a driver for semiconductor memory, comprising: a storage unit configured to store a bucket charge current value; a selection controller configured to read the bucket charge current value stored in the storage unit based on an inputted memory cell address and a target charge current value, and output a bucket charge current select signal and a target charge current select signal corresponding to the bucket charge current value the target charge current value, respectively; a current mirror unit; and a current supply unit configured to supply a bucket charge current and a target charge current in response to the bucket charge current select signal and a target charge current select signal by using the current mirror unit.

The current supply unit comprises: a charge bucket configured to selectively switch one or more of a plurality of capacitors in response to the bucket charge current select signal, the plurality of capacitors coupled in parallel to each other; a bias unit configured to apply a predetermined current, the bias unit comprising a current source coupled between a power supply voltage and a ground terminal; a negative feedback unit configured to output a negative feedback voltage according to a voltage obtained by coupling an output voltage of the charge bucket and an output voltage of the bias unit; the current mirror unit configured to generate an output current using the negative feedback voltage and the target charge current select signal; and a reset voltage generation unit configured to generate a reset voltage so as to reset the current mirror unit after the output current is provided to the memory cell.

The current mirror unit comprises: a power supply voltage controller configured to control the applied power supply voltage using the negative feedback voltage; a reference current provider coupled between the power supply voltage controller and the negative feedback unit and configured to pass a reference current; and a mirrored current generator configured to selectively switch one or more of a plurality of current-mirror switching elements in response to the target charge current select signal so as to couple the memory cell to the power supply voltage and generate the output current, the plurality of current-mirror switching elements being coupled in parallel to each other.

DETAILED DESCRIPTION

Figure 1:
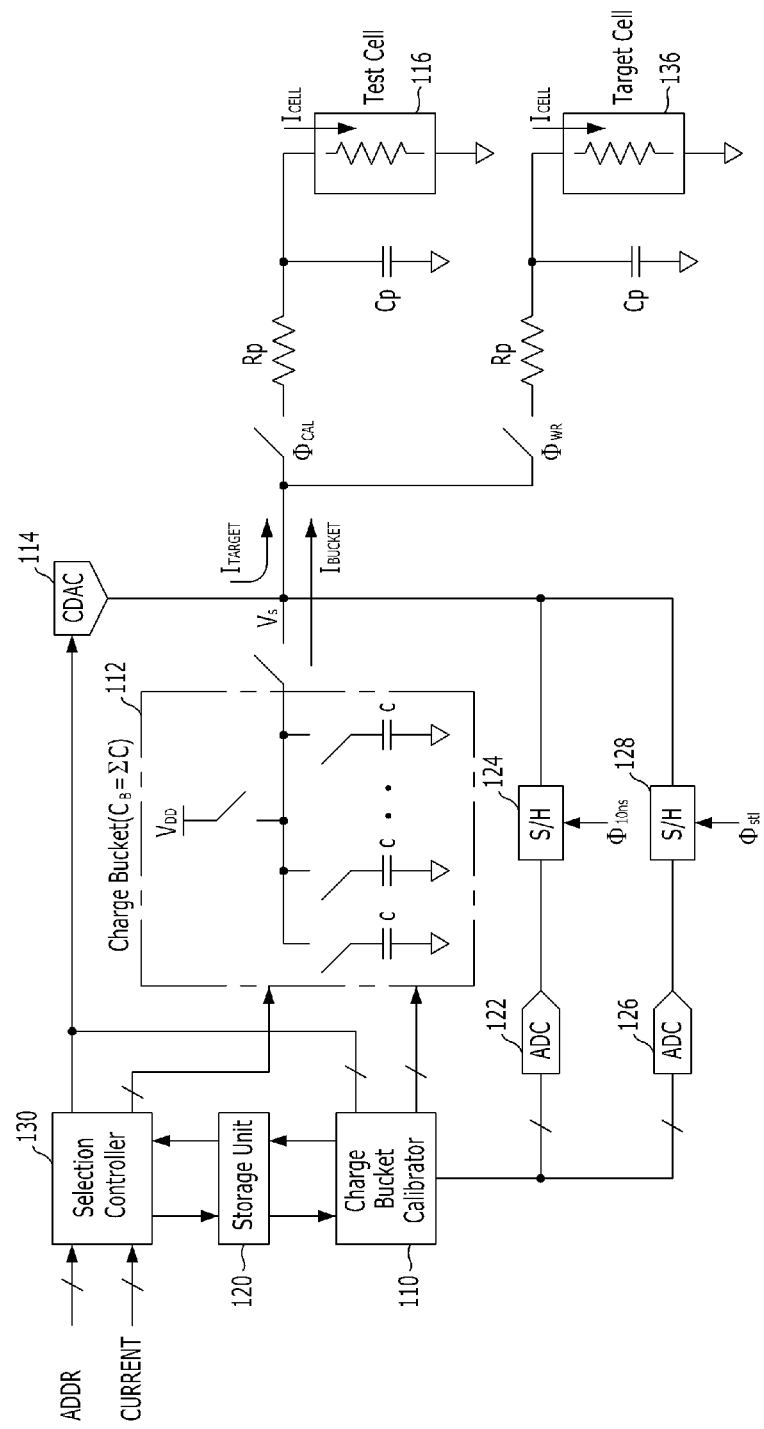
FIG. 1 is a block diagram illustrating a schematic configuration of a driver in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Throughout the disclosure, like reference numerals refer to parts having the same configuration and operation throughout the various figures and embodiments of the present invention. The accompanying drawings are provided for convenience of descriptions, and the shapes and scales of the parts may be exaggerated or omitted.

When the embodiments are specifically described, duplicated descriptions and descriptions of technology obvious to those skilled in the art are omitted. In the following descriptions, when a part includes a component, the part may also include other components in addition to the component as long as specific conditions are not given.

Throughout the specification, terms such as "~unit", "~er", and "~module" represent a unit to process at least one function or operation. They may be implemented in hardware, software, or a combination of hardware and software. Furthermore, when a part is electrically connected to another part, it may include a case in which the parts are connected to each other with another component interposed therebetween as well as a case in which the parts are directly connected to each other.

Furthermore, terms including ordinal numbers such as first and second may be used to describe various components, but the components are not limited to the terms. The terms are used only to distinguish one component from other components. For example, a second component may be referred to as a first component, and the first component may be referred to as the second component, without departing from the scope of the present invention.

The embodiments of the present invention provide a device and method for writing data to a semiconductor memory such as, for example, a memory cell of PRAM or ReRAM according to a current driving method. As typically known, the current driving method refers to a method for writing data by supplying a target charge current to a memory cell through a data line. In the embodiments of the present invention, the detailed descriptions for the configuration and operation of the current driving method are omitted. The following descriptions are focused on the configuration and operation of the device and method in accordance with the embodiments of the present invention.

FIG. 1 is block diagram illustrating a schematic configuration of a driver in accordance with an embodiment of the present invention. Referring to FIG. 1, the driver for semiconductor memory in accordance with the embodiment of the present invention includes a selection controller 130, a current supply unit 114, a charge bucket calibrator 110, and a storage unit 120. The selection controller 130 is configured to select a target charge current $I_{TARGET}$ and a bucket charge current $I_{BUCKET}$ with respect to each memory cell 136 (target cell 136). The current supply unit 114 is configured to supply a current corresponding to the current selected by the selection controller 130 to the memory cell 136. The charge bucket calibrator 110 is configured to calibrate the bucket charge current $I_{BUCKET}$. The storage unit 120 is configured to store data on the address, the target charge current $I_{TARGET}$, and the bucket charge current $I_{BUCKET}$ with respect to the memory cell 136.

Although FIG. 1 illustrates one memory cell 136, a semiconductor memory typically includes a plurality of memory cells arranged in a matrix shape, each of which has a resistor. Each of the memory cells may be modeled to have a parasitic resistance $R_P$ and parasitic capacitance $C_P$. Such parasitic components have a different value for each of the memory cells 136 based on various factors such as resistance of the wiring components and capacitances between conductors facing each other.

The current supply unit 114 in accordance with the embodiment of the present invention provides the bucket charge current $I_{BUCKET}$ in addition to the target charge current $I_{TARGET}$. Here, a pre-charge current capable of instantly charging a parasitic capacitance existing in the memory cell may be provided mostly by the bucket charge current $I_{BUCKET}$. The current supply unit 114 switches a predetermined number of capacitor combinations in response to an applied bucket charge current select signal, thereby outputting the bucket charge current $I_{BUCKET}$.

In the current driving method according to an embodiment of the present invention, a data write operation is performed by applying the target charge current $I_{TARGET}$ to each memory cell 136. Referring to FIG. 1, an address ADDR of the memory cell 136 and current data CURRENT are inputted to the selection controller 130. The current data CURRENT includes the target charge current data of the target charge current $I_{TARGET}$ flowing into the memory cell 136 corresponding to the address ADDR.

When the selection controller 130 selects and outputs a target charge current select signal corresponding to the current data CURRENT and the address ADDR by referring to the storage unit 120, the current supply unit 114 supplies the target charge current $I_{TARGET}$ to the memory cell 136 corresponding to the address ADDR.

On the other hand, in a pre-charge mode, the driver for a semiconductor memory in accordance with an embodiment of the present invention may supply the target charge current $I_{TARGET}$ and the bucket charge current $I_{BUCKET}$ to the memory cell 136.

That is, the selection controller 130 provides a bucket charge current select signal to a bucket charge current supply unit 112 by referring to the storage unit 120. The bucket charge current supply unit 112 outputs the bucket charge current $I_{BUCKET}$ to the memory cell 136 corresponding to the address ADDR by switching a predetermined number of capacitor combinations in response to the bucket charge current select signal outputted from the selection controller 130.

Meanwhile, the pre-charge current to instantly charge the parasitic capacitance $C_P$ existing in the memory cell 136 may be provided mostly by the bucket charge current $I_{BUCKET}$.

Since each of the memory cells 136 is likely to have a different parasitic capacitance $C_P$ or parasitic resistance $R_P$, bucket charge currents $I_{BUCKET}$ corresponding to different memory cells 136 may vary in current values. Accordingly, the charge bucket calibrator 110 may calibrate each of the bucket charge currents $I_{BUCKET}$ with respect to each of the memory cells 136, before a data writing mode. A data writing mode is also a data write operation to a semiconductor memory.

Figure 2:
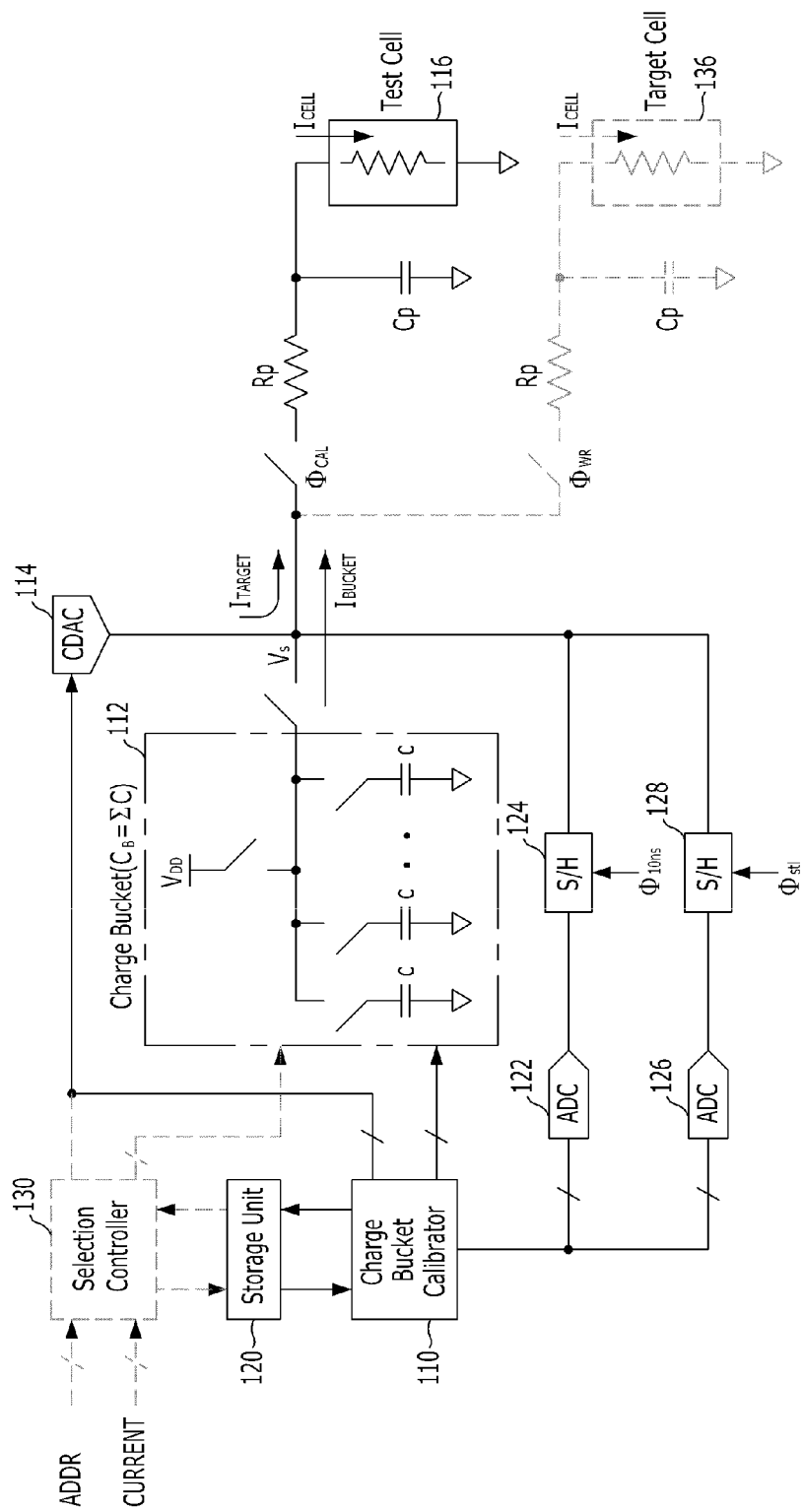
FIG. 2 is a block diagram illustrating a state in which the driver for a semiconductor memory in accordance with the embodiment of the present invention operates in a calibration mode.
Figure 4:
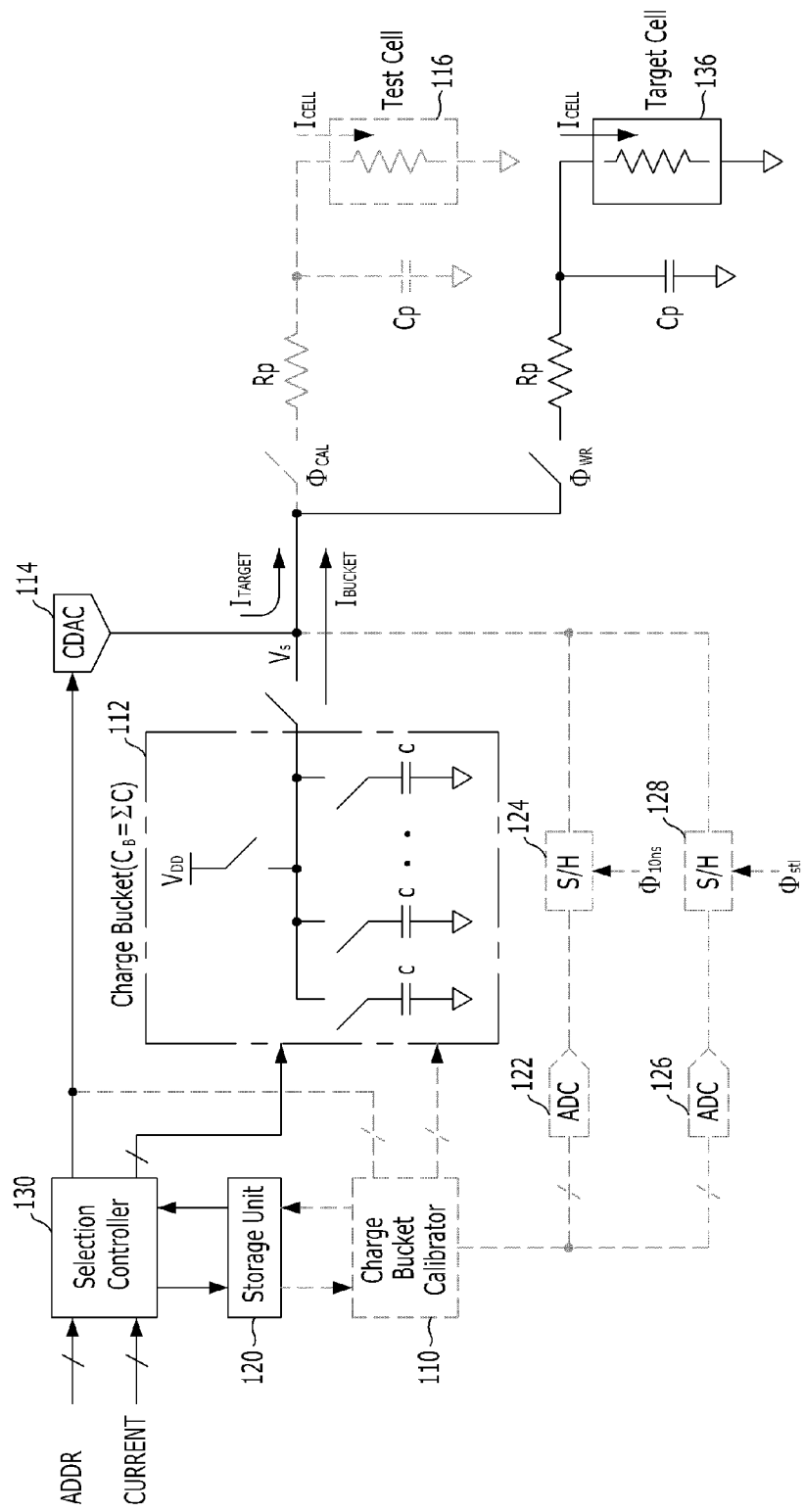
FIG. 4 is a block diagram illustrating a state in which the driver for a semiconductor memory in accordance with the embodiment of the present invention operates in a data writing mode.

FIG. 2 is a block diagram illustrating a state in which the driver for a semiconductor memory in accordance with an embodiment of the present invention operates in a calibration mode. FIG. 4 is a block diagram illustrating a state in which the driver for a semiconductor memory in accordance with an embodiment of the present invention operates in the data writing mode.

Hereinafter, an embodiment in which the driver for a semiconductor memory in accordance with an embodiment of the present invention operates in the calibration mode will be described in detail with reference to FIG. 2.

As illustrated in FIG. 2, a test cell 116 corresponding to each memory cell 136 is arranged. The test cell 116 has substantially similar components $R_P$ and $C_P$ to those of the corresponding memory cell 136. For example, the test cell 116 may be arranged at a position close to the memory cell 136 or arranged in a separate dummy area so as to have a similar wiring environment to that of the memory cell 136. The test cell 116 is used to calibrate the bucket charge current $I_{BUCKET}$, thereby providing the calibrated bucket charge current $I_{BUCKET}$ to the corresponding memory cell 136. In an embodiment of the present invention, each of the test cells 116 may be arranged to have one-to-one correspondence to each of the memory cells 136. In another embodiment of the present invention, one test cell 116 may be arranged to correspond to a plurality of memory cells 136.

Referring to FIG. 2, the charge bucket calibrator 110 provides a target charge current select signal and a bucket charge current select signal to the current supply unit 114 and the bucket charge current supply unit 112, respectively. As illustrated in FIG. 2, the current supply unit 114 supplies the target charge current $I_{TARGET}$ to the test cell 116 having an address corresponding to the address of the memory cell 136 in response to the target charge current select signal. The bucket charge current $I_{BUCKET}$ may be defined as a predetermined current depending on a position of the corresponding memory cell 136 or a current determined in the previous calibration mode. The bucket charge current supply unit 112 supplies the bucket charge current $I_{BUCKET}$ to the test cell 116 in parallel to the target charge current $I_{TARGET}$ in response to the inputted bucket charge current select signal generated from the selection controller 130.

In accordance with the embodiment of the present invention as shown in, for example, FIG. 2, the bucket charge current supply unit 112 may include a plurality of capacitors C. As illustrated in FIG. 2, the plurality of capacitors may be arranged in parallel to each other and then one or more of the plurality of capacitors are selectively switched in order to generate the predetermined the bucket charge current $I_{BUCKET}$. When one or more of the plurality of capacitors are selectively switched, each of the selectively switched capacitor will be coupled together in parallel, and each of the selectively switched capacitor will also be coupled in series to the voltage source $V_{DD}$. For example, as a number of capacitors selectively coupled in parallel increases, the output current of the bucket charge current supply unit 112 increases, thereby supplying a larger bucket charge current $I_{BUCKET}$ to the test cell 116.

Figure 3:
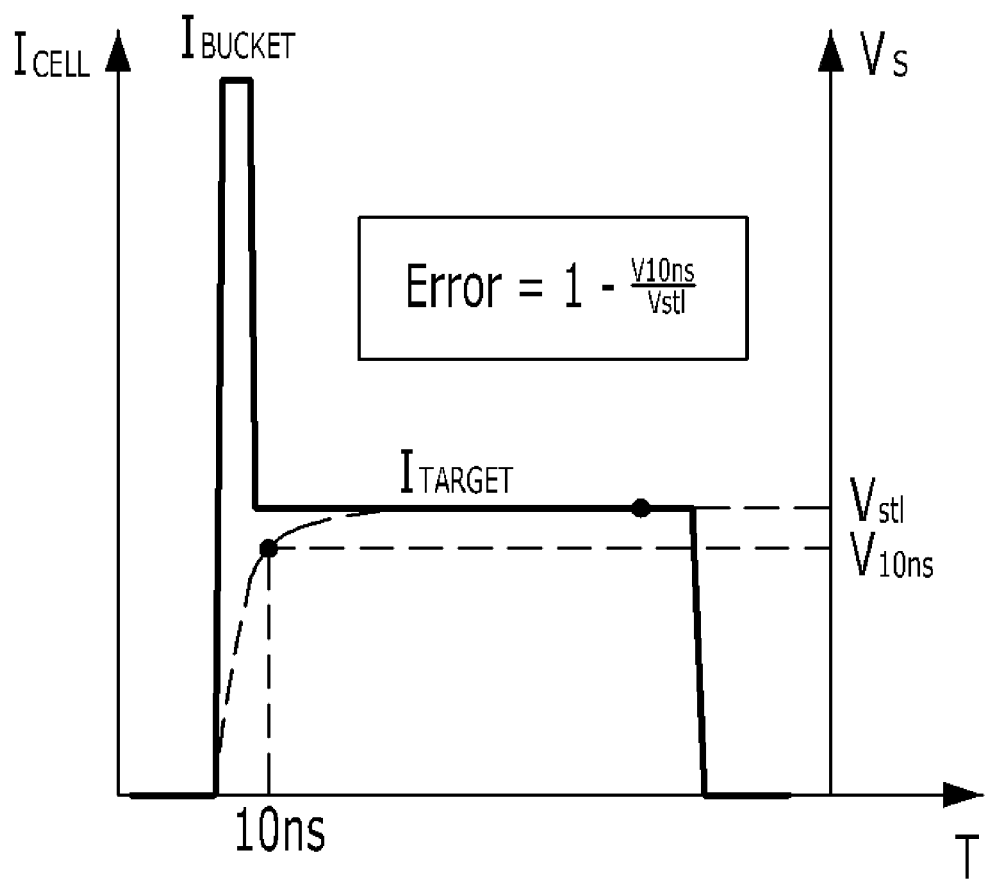
FIG. 3 is a graph illustrating a bucket charge current and a target charge current in accordance with the embodiment of the present invention.

FIG. 3 is a graph illustrating a waveform of the bucket charge current $I_{BUCKET}$. Referring to FIG. 3, in a pre-charge period, the pre-charge current is generated mostly by the bucket charge current $I_{BUCKET}$, which is larger than the target charge current $I_{TARGET}$. The bucket charge current $I_{BUCKET}$ pre-charges the parasitic capacitance $C_P$ of the test cell 116 during the pre-charge period. Then, a data writing operation is performed by the target charge current $I_{TARGET}$.

Here, the charge bucket calibrator 110 calibrates the bucket charge current $I_{BUCKET}$ for the test cell 116 so that an error rate depending on the bucket charge current $I_{BUCKET}$ falls within a permissible error range. For example, the error rate may be defined in terms of a ratio of voltage ($V_{setting}$) at the end of the pre-charge period which the bucket charge current $I_{BUCKET}$ flows into the test cell 116 and a voltage $V_{sti}$ at the end of the stabilization period which the target current flows into the test cell 116. Various types of methods or configurations may be used to calibrate the bucket charge current $I_{BUCKET}$. In an embodiment shown in FIG. 2, a first AD converter 122, a first sample and hold unit 124, a second AD converter 126, and a second sample and hold unit 128 are used to determine whether the error rate falls within the permissible error range.

In an embodiment illustrated in FIG. 3, a voltage $V_{settling}$, i.e., $V_{10\ ns}$ of the test cell 116 is determined at approximately 10 ns after the bucket charge current $I_{BUCKET}$ begins to be supplied from the bucket charge current supply unit 112. The voltage $V_{10\ ns}$ and a voltage $V_{stl}$ of the test cell 116 in the stabilization period may be sampled by the first sample and hold unit 124 and the second sample and hold unit 128, respectively. Then, the charge bucket calibrator 110 calculates the error rate by using Equation 1.

$$\text{Error} = 1 - \frac{V_{settling}}{V_{stl}} \quad \text{[Equation 1]}$$

In an embodiment, the permissible error range may be set from approximately 0.2% to 5.2%. If the error rate is less than approximately 0%, the pre-charge voltage may be excessively high to lead to an overshoot in the voltage $V_s$. On the other hand, if the error rate exceeds approximately 5.4%, it would be difficult to write data at a desired speed. Therefore, the permissible error range is typically set, for example, from approximately 0.2% to 5.2% in consideration of a safety margin.

The permissible error range specified above is only an example, and may be set differently depending on various factors such as the environment of the nonvolatile memory and desired write speed.

After the charge bucket calibrator 110 calibrates the bucket charge current $I_{BUCKET}$ so that a defined error rate falls within the permissible error range, the charge bucket calibrator 110 stores the target charge current data and the bucket charge current data on the target charge current $I_{TARGET}$ and the bucket charge current $I_{BUCKET}$, respectively, in the storage unit 120. The bucket charge current data and the target charge current data stored in the storage unit 120 may be referred to in a data writing mode with respect to a memory cell 136 corresponding to the test cell 116.

Referring to FIG. 4, the data writing mode in accordance with an embodiment of the present invention will be described hereinafter.

In the data writing mode as illustrated in FIG. 4, the charge bucket calibrator 110 is disabled. The selection controller 130 receives a memory cell address ADDR and target charge current data CURRENT of a memory cell corresponding to the address ADDR, and selects a bucket charge current value corresponding to the memory cell 136 by referring to the storage unit 120. The selection controller 130 outputs a target charge current select signal and a bucket charge current select signal to the current supply unit 114 and the bucket charge current supply unit 112, respectively. The current supply unit 114 provides the target charge current $I_{TARGET}$ to the memory cell 136 in response to the target charge current select signal that is generated from the selection controller 130. Furthermore, the bucket charge current supply unit 112 provides the bucket charge current $I_{BUCKET}$ to the memory cell 136 in response to the bucket charge current select signal that is generated from the selection controller 130.

According to the above-described operation, the pre-charging and data writing of the memory cell 136 are performed by the bucket charge current $I_{BUCKET}$ and the target charge current $I_{TARGET}$, respectively, as illustrated in FIG. 3.

Figure 5:
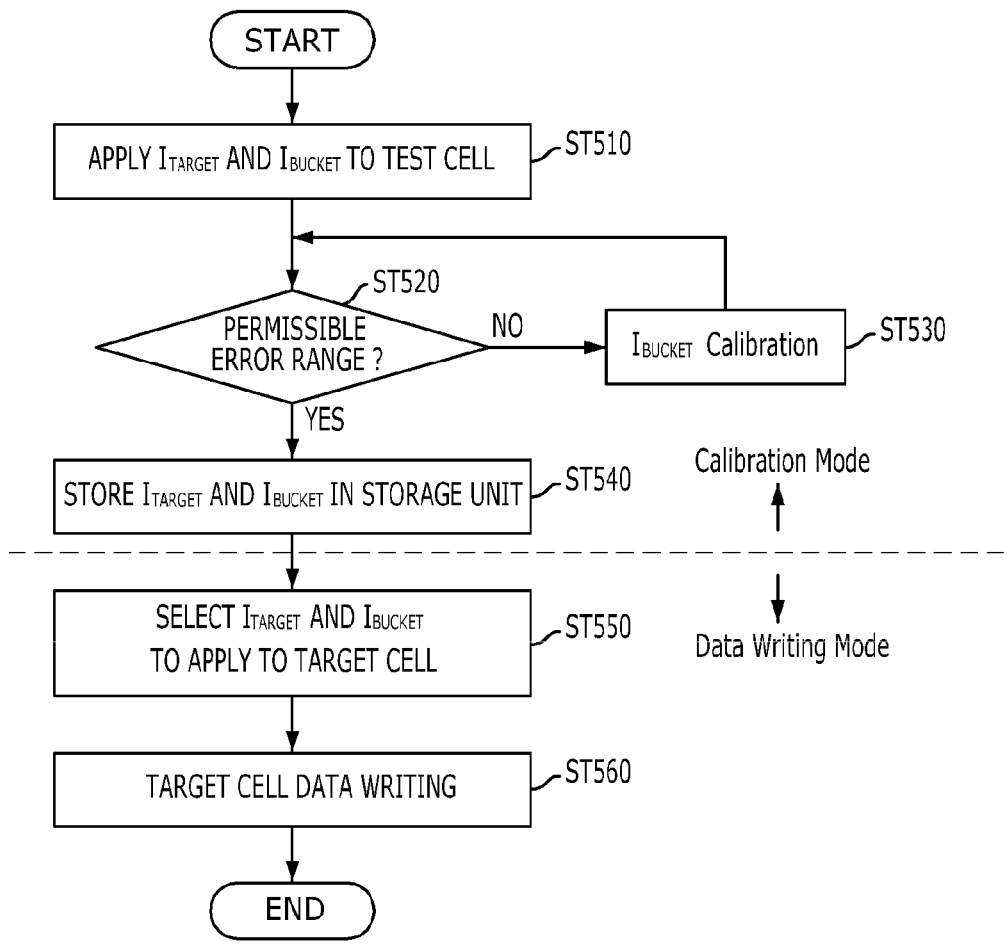
FIG. 5 is a flow chart showing a write driving method in accordance with the embodiment of the present invention.

FIG. 5 is a flow chart showing a write driving method in accordance with an embodiment of the present invention.

Referring to FIG. 5, the write driving method in accordance with this embodiment of the present invention will be described hereinafter.

The write driving method in accordance with this embodiment of the present invention includes a calibration step and a data writing step. The calibration step is performed on a test cell 116 corresponding to the memory cell 136 to obtain (or to calibrate) a bucket charge current $I_{BUCKET}$ to be used to pre-charge the memory cell 136, as described above. After the test cell 116 is used to calibrate the bucket charge current $I_{BUCKET}$, the data writing step is performed by supplying a target charge current $I_{TARGET}$ and the bucket charge current $I_{BUCKET}$ to the memory cell 136. As discussed above, this bucket charge current $I_{BUCKET}$ supplied to the memory cell 136 was previously calibrated during the previous calibration step.

Referring to FIG. 5, the calibration step starts with a step ST510 of applying the target charge current $I_{TARGET}$ and the bucket charge current $I_{BUCKET}$ to the test cell 116. The process in which the charge bucket calibrator 110 controls the current supply unit 114 and the bucket charge current supply unit 112 to supply the target charge current $I_{TARGET}$ and the bucket charge current $I_{BUCKET}$, respectively, has been already described above.

Then, the bucket charge current $I_{BUCKET}$ is calibrated so that an error rate depending on the bucket charge current $I_{BUCKET}$ falls within a permissible error range. During this step, whether or not the error rate defined in terms of voltage value $V_s$ of the test cell 116 falls within the permissible error range is determined at step ST520. As previously discussed above, the error rate is partly dependent on the voltage $V_s$ at the end of the pre-charge period during which the bucket charge current $I_{BUCKET}$ flows into the test cell 116 When the error rate does not fall within the permissible error range, the bucket charge current $I_{BUCKET}$ is adjusted (or calibrated) at step ST530. The steps ST520 and ST530 are repeated until it is determined that the error rate falls within the permissible error range, and it will then be appropriate to store the bucket charge current value and the target charge current value in the storage unit 120 at step ST540. The process of determining the permissible error range and the process of calibrating the bucket charge current $I_{BUCKET}$ have been already described above.

When it is determined at step ST520 that the error rate falls within the permissible error range because the bucket charge current $I_{BUCKET}$ determined in the previous calibration step renders the error rate in the present calibration step to fall within the permissible error range, the step ST530 may be omitted and is no longer necessary.

Referring to FIG. 5, the data writing step is performed as follows: a target charge current $I_{TARGET}$ to be applied to a target memory cell (that is, a target cell recognized by address information of a memory cell 136) and a bucket charge current $I_{BUCKET}$ are selected at step ST550, and data is written into the target cell at step ST560.

The example in which the target charge current $I_{TARGET}$ and the bucket charge current $I_{BUCKET}$ are selected by the selection controller 130 and data is written into the memory cell 136 through the current supply unit 114 according to the current driving method has been already described above.

Meanwhile, the method of driving the driver for a semiconductor memory in accordance with this embodiment of the present invention in FIG. 5 may further include grouping memory cells to which the same bucket charge current $I_{BUCKET}$ flows.

Although not shown, the cell grouping step may be added between the calibration step and the data writing step in the method shown in FIG. 5. During the cell grouping step, a plurality of memory cells 136 may be grouped when the same bucket charge current $I_{BUCKET}$ renders all the error rates of the memory cells 136 fall within the permissible error range, such that the number of the memory cells in each cell group is maximized. In the presence of the cell grouping step, the bucket charge current supply unit 112 may perform a minimum number of capacitor combination switching operations. Therefore, a time required for the calibration step and for the data writing step may be reduced. Furthermore, since a larger number of cells 136 can be driven by a smaller number of capacitors by the cell grouping step, it is possible to reduce the total capacitor area that is allocated to the bucket charge current supply unit(s) 112 in a driver in accordance with an embodiment of the invention.

Figure 6:
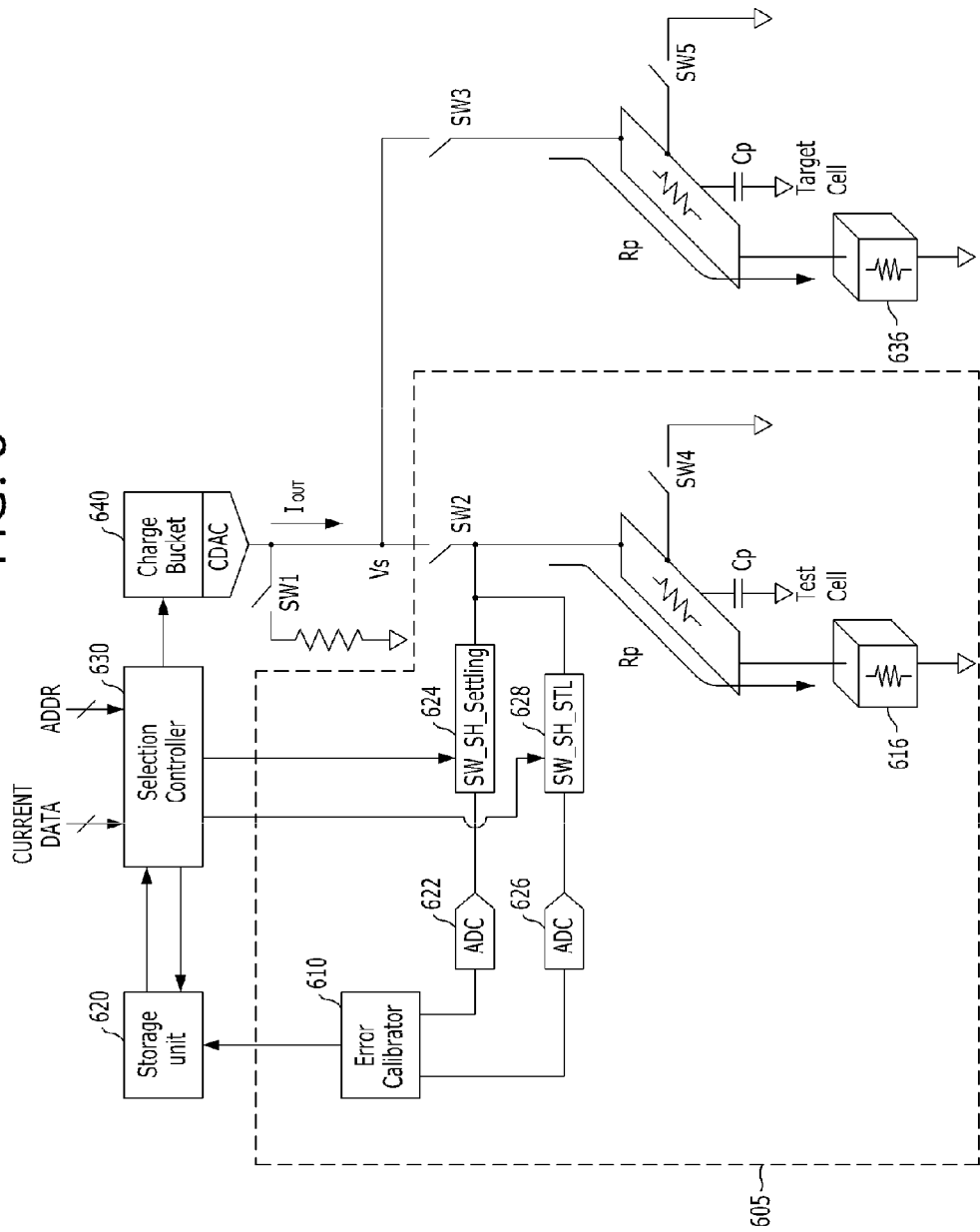
FIG. 6 illustrates a block diagram of a driver for a semiconductor memory in accordance with another embodiment of the present invention.

FIG. 6 is a block diagram of a driver for a semiconductor memory in accordance with another embodiment of the present invention.

Referring to FIG. 6, the driver for a semiconductor memory in accordance with the embodiment of the present invention includes a storage unit 620, a selection controller 630, a current supply unit 640, and a memory cell 636.

The storage unit 620 in accordance with this embodiment of the present invention may match and store the address ADDR of the memory cell 636 and bucket charge current data. In an embodiment, the address ADDR and the bucket charge current data may be stored in the form of a lookup table.

The selection controller 630 in accordance with this embodiment of the present invention is configured to receive the address ADDR of the memory cell 636 and current data corresponding to a target charge current $I_{TARGET}$. This current data (target charge current data) is shown as CURRENT DATA in FIG. 6. Subsequently, the selection controller 630 selects the address ADDR of the memory cell 636 and the bucket charge current data corresponding to the received target charge current data CURRENT DATA and the address ADDR by referring to the storage unit 620, and output a bucket charge current select signal corresponding to the selected bucket charge current data and a target charge current select signal corresponding to the target charge current data.

The current supply unit 640 in accordance with this embodiment of the present invention supplies the bucket charge current $I_{BUCKET}$ and the target charge current $I_{TARGET}$ to the corresponding memory cell 636 in response to the bucket charge current select signal and the target charge current select signal which are provided from the selection controller 630. In FIG. 6, the currents $I_{BUCKET}$ and $I_{TARGET}$ are also shown as the current $I_{OUT}$ for ease of discussion.

Meanwhile, a first switch SW1 provides a current path in a standby state so that the current supply unit 640 is ready to operate in a short period of time, a second switch SW2 is used in the calibration mode to control a current supplied to the test memory cell 616, a third switch SW3 is used in the data writing mode to control a current supplied to the target memory cell 636, and fourth and fifth switch SW4 and SW5 are used to discharge electric charges existing in the test memory cell 616 and the target memory cell 636, respectively, before the current is supplied to the memory cell.

The driver for a semiconductor memory in accordance with this embodiment of the present invention may further include a bucket charge current setting unit 605. The bucket charge current setting unit 605 in accordance with this embodiment of the present invention includes an error calibrator 610, one or more test cells 616, a first AD converter 622, a second AD converter 626, a first sample and hold unit 624, and a second sample and hold unit 628.

In an embodiment, the error calibrator 610 is configured to calibrate a bucket charge current $I_{BUCKET}$ for the test cell 616 so that an error rate depending on the bucket charge current $I_{BUCKET}$ falls within a permissible error range. For example, the error rate may be defined in terms of a ratio of a voltage $V_s$ at the end of a pre-charge period during which the bucket charge current $I_{BUCKET}$ flows to the test cell 616 to a voltage $V_s$ in a stabilization period after the current flowing into the test cell 616 drops to the target charge current $I_{TARGET}$. In FIG. 6, the first AD converter 622, the first sample and hold unit 624, the second AD converter 626, and the second sample and hold unit 628 are used to determine whether the error rate falls within the permissible error range.

In an embodiment, a voltage $V_{10\,ns}$ at 10 ns after the bucket charge current $I_{BUCKET}$ begins to be supplied from the current supply unit 640 is compared to a voltage $V_{stl}$ in the stabilization period. Referring to FIG. 6, the first sample and hold unit 624 and the second sample and hold unit 628 sample the voltage $V_{10\,ons}$ of the test cell 616 at 10 ns and the voltage $V_{stl}$ of the test cell 616 in the stabilization period, respectively. Then, the error calibrator 610 calculates the error rate by using Equation 1.

The error calibrator 610 calibrates the bucket charge current $I_{BUCKET}$ so that the error rate falls within the permissible error range, and then matches and stores the bucket charge current value, the target charge current value, and an address ADDR of the memory cell 636 corresponding to the test cell 616 in the storage unit 620. The bucket charge current value (corresponding to the bucket charge current $I_{BUCKET}$) stored in the storage unit 620 may be referred to, by the selection controller 630, in the data writing mode.

Hereinafter, an embodiment in which the second switch SW2 is turned on so that the driver in accordance with an embodiment of the present invention operates in the calibration mode will be described in detail with reference to FIG. 6.

As illustrated in FIG. 6, the test cell 616 corresponding to each memory cell 636 is arranged. The test cell 616 has substantially similar parasitic components $R_P$ and $C_P$ to those of the corresponding memory cell 636. For example, the test cell 616 may be arranged at a position close to the memory cell 636 or arranged in a separate dummy area so as to have a similar wiring environment to that of the memory cell 636. The test cell 616 is used to calibrate the bucket charge current $I_{BUCKET}$, thereby providing the calibrated bucket charge current $I_{BUCKET}$ to the corresponding memory cell 636.

In accordance with an embodiment of the present invention, each of the test cells 616 may be arranged to have one-to-one correspondence to each of the memory cells 636. Furthermore, in another embodiment of the present invention, the test cell 616 may be arranged to correspond to a plurality of memory cells 636.

Referring to FIG. 6, the current supply unit 640 receives a target charge current select signal and a bucket charge current select signal from the selection controller 630, and supplies the target charge current $I_{TARGET}$ to the test cell 616 in response to the target charge current select signal. The bucket charge current $I_{BUCKET}$ may be defined as a predetermined current depending on a position of the corresponding memory cell 636 or a current determined from a previous calibration operation. Referring to FIG. 6, the current supply unit 640 supplies an output current $I_{OUT}$ which corresponds to the bucket charge current $I_{BUCKET}$ and the target charge current $I_{TARGET}$ at the same time in response to the inputted bucket charge current select signal during the pre-charge period (e.g., 10 ns), and to the target charge current $I_{TARGET}$ to the test cell 616 after the pre-charge period.

Figure 7:
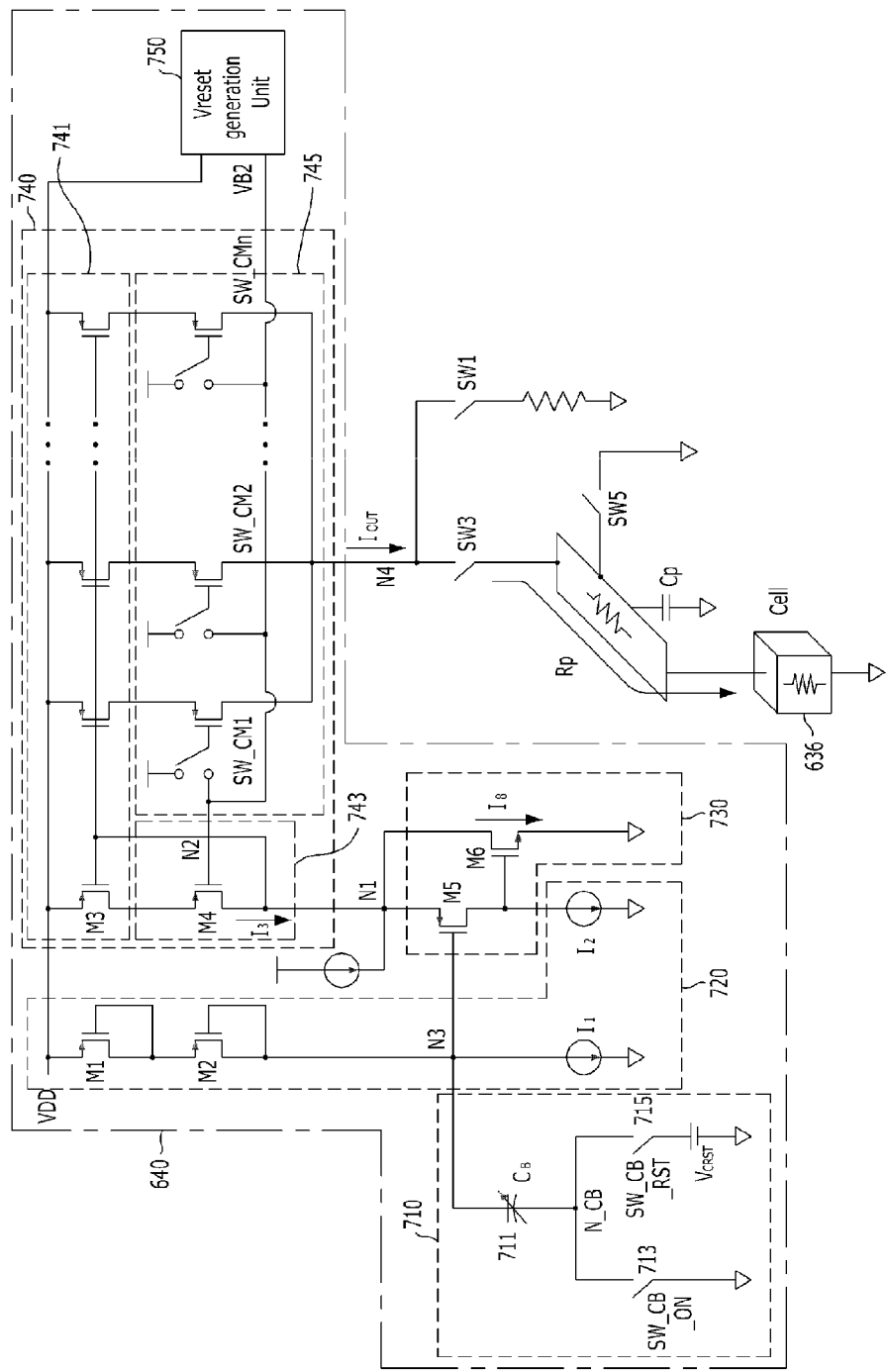
FIG. 7 illustrates a detailed circuit diagram of a current supply unit in accordance with another embodiment of the present invention.

FIG. 7 is a detailed circuit diagram of the current supply unit 640 in accordance with an embodiment of the present invention. The current supply unit 640 includes a charge bucket 710, a bias unit 720, a negative feedback unit 730, a current mirror unit 740, and a reset voltage generation unit 750.

The charge bucket 710 includes a plurality of capacitors 711, a reset switch 715 (SW_CB_RST), and a bucket current switch 713 (SW_CB_ON). The plurality of capacitors 711 are coupled in parallel so as to be selectively switched in response to the bucket charge current select signal from the selection controller 630. The reset switch 715 is coupled between the plurality of capacitors 711 and a ground terminal so as to reset a plurality of selected capacitors 711. The bucket current switch 713 is coupled between the plurality of capacitors 711 and the ground terminal so as to discharge the plurality of selected capacitors 711.

The bias unit 720 includes current sources I1 and I2 coupled between a power supply voltage VDD and the ground terminal and configured to apply a predetermined current at all times.

The negative feedback unit 730 is controlled by a voltage VN3 obtained by coupling an output voltage of the charge bucket 710 and an output voltage of the bias unit 720 and outputs a negative feedback voltage. More specifically, as the voltage VN3 increases, a current I8 flowing through the transistor M6 decreases, and vice versa.

The current mirror unit 740 includes a power supply voltage controller 741, a reference current provider 743, and a mirrored current generator 745. The power supply voltage controller 741 is configured to control the applied power supply voltage VDD (power supply voltage VDD) using the negative feedback voltage from the negative feedback unit 730. The reference current provider 743 is coupled between the power supply voltage controller 741 and the negative feedback unit 730 and configured to pass a reference current. The mirrored current generator 745 is coupled between the power supply voltage controller 741 and an output node N4. The mirror current generator 745 is configured to selectively switch a plurality of switching elements SW_CM1, SW_CM2, ..., SW_CMn coupled to each other in parallel by using the target charge current select signal so as to output an the output current $I_{OUT}$ flowing into the memory cell 636 through the output node N4 and where n is an integer. The plurality of switching elements SW_CM1, SW_CM2, ..., SW_CMn are coupled in parallel between the controlled power supply voltage VDD and the output node N4.

The reset voltage generation unit 750 is configured to reset the voltage of a second node N2 and maintain the voltage of the second node N2 to a predetermined level, when all of the switching elements are turned off after the current $I_{OUT}$ is provided to the memory cell. The second node N2 is coupled to the reference current provider 743 and mirrored current generator 745.

Hereinafter, the operation of the current supply unit 640 in accordance with the embodiment of the present invention will be described in more detail.

The operation of the charge bucket 710 is performed as follows. When the reset switch 715 is turned on so that a reset voltage source $V_{CRST}$ supplies power to charge a plurality of capacitors 711, the bucket current switch 713 is turned on. The reset switch 715 (coupled between the plurality of capacitors and the ground terminal) is configured to reset the selectively switched capacitors. The bucket current switch 713 (coupled between the plurality of capacitors and the ground terminal) is configured to discharge the selectively switched capacitors.

Then, the voltage of a charge bucket node N_CB decreases in a stepwise waveform (refer to FIG. 7). Then, as illustrated in FIG. 7, the voltage of a third node N3 inside the bias unit 720 rapidly decreases, and then is restored during a pre-charge time. The output voltage waveform of the output node N1 of the negative feedback unit 730 has a similar shape to that of the third node N3, because a gate-source voltage of a transistor M5 between the nodes N3 and N1 remains the substantially same to maintain a constant current I2 through the transistor M5. The voltage waveform of the output node N1 may also depend on the operation of the negative feedback unit 730. The output voltage waveform of the output node N1 of the negative feedback unit 730 also has the same shape as the control node N1 of the power supply voltage control unit 741, because the control node N1 of the power supply voltage control unit 741 corresponds to the output node N1 of the negative feedback unit 730.

When the output voltage of the output node N1 drops and restores during the pre-charge time, each output terminal of the selectively switched current-mirror switching elements SW_CM1, SW_CM2, ..., SW_CMn inside the mirrored current generator 745 outputs a current having a shape such that a peak current corresponding to the bucket charge current $I_{BUCKET}$ during the pre-charge period is added to a square wave form corresponding to the target charge current $I_{TARGET}$.

A current waveform of the output current $I_{OUT}$ is formed by the current wave forms outputted from the output terminals of the current-mirror switching elements SW_CM1, SW_CM2, ..., SW_CMn.

Figure 8:
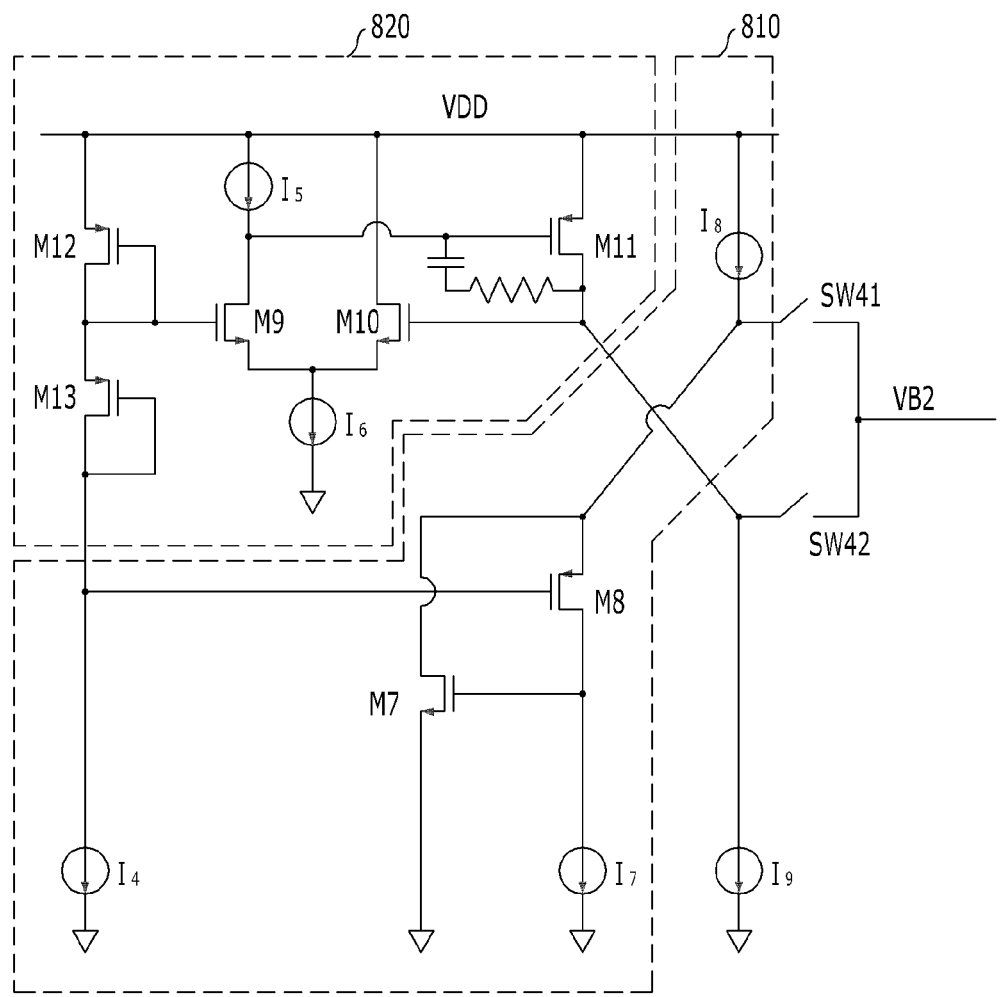
FIG. 8 illustrates a detailed circuit diagram of a reset voltage generation unit in accordance with another embodiment of the present invention.
Figure 9:
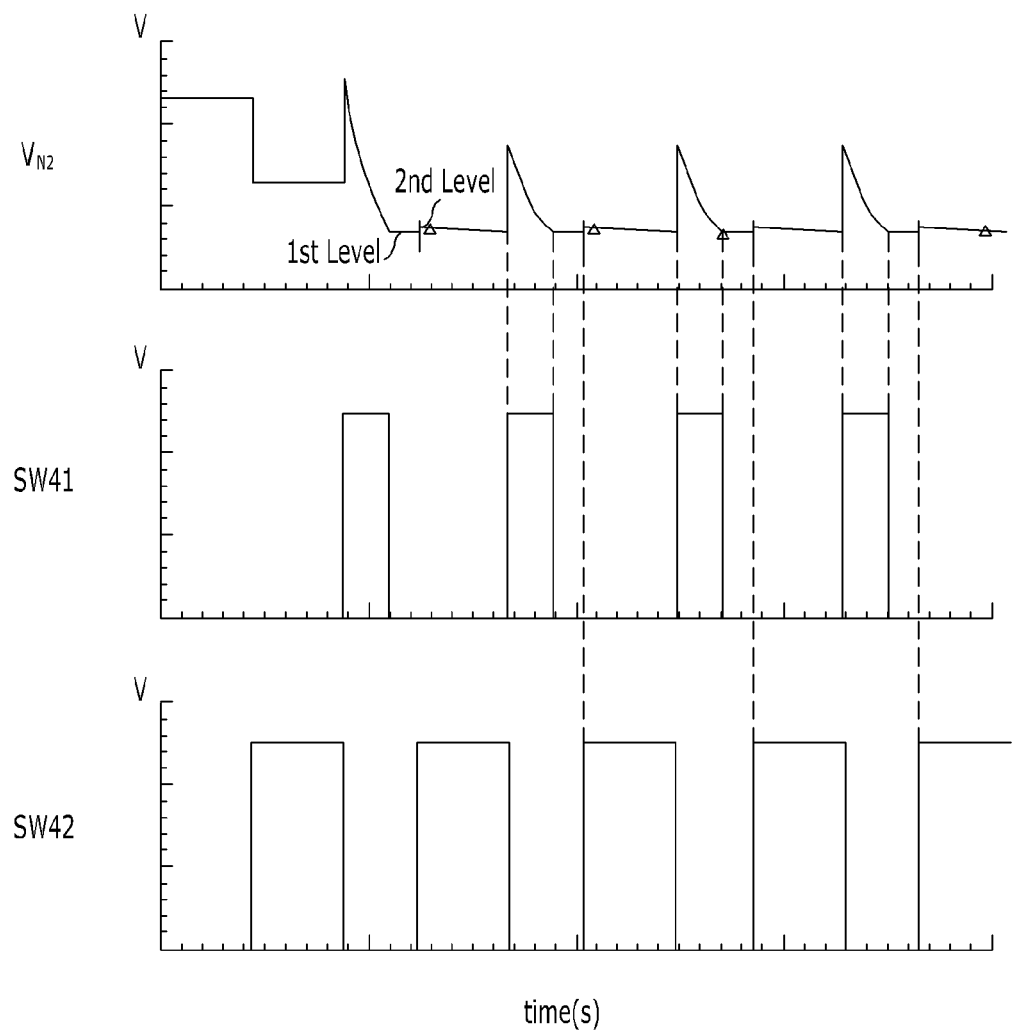
FIG. 9 illustrates a waveform diagram of voltages at a node in response to switching operations of switches inside the reset voltage generation unit in accordance with another embodiment of the present invention.

FIG. 8 is a detailed circuit diagram of the reset voltage generation unit 750 in accordance with an embodiment of the present invention. FIG. 9 is a waveform diagram of voltages of a second node N2 in response to output voltage signals from a discharge switch SW41 and a charge switch SW42 included in the reset voltage generation unit 750.

The reset voltage generation unit 750 in accordance with the embodiment of the present invention includes a discharge unit 810, a charge unit 820, a discharge switch SW41, and a charge switch SW42. The discharge unit 810 is configured to discharge the voltage of the second node N2 to a predetermined first level. The charge unit 820 is configured to charge the voltage of the second node N2 with a predetermined second level. The discharge switch SW41 is configured to control the electrical connection between the second node N2 and the discharge unit 810. The charge switch SW42 is configured to control the electrical connection between the second node N2 and the charge unit 820.

When the current supply to the memory cell 636 is terminated, all of the current-mirror switching elements SW_CM1, SW_CM2, ..., SW_CMn which have been selectively turned on are turned off. At this time, the voltage of the second node N2 abruptly increases. Subsequently, when the discharge switch SW41 is turned on to couple the second node N2 to the ground terminal through transistors M7 and M8, the voltage of the second node N2 rapidly decreases, as shown in FIG. 9.

Then, the charge switch SW42 is turned on so as to increase the voltage of the second node N2 to the second level.

Figure 10:
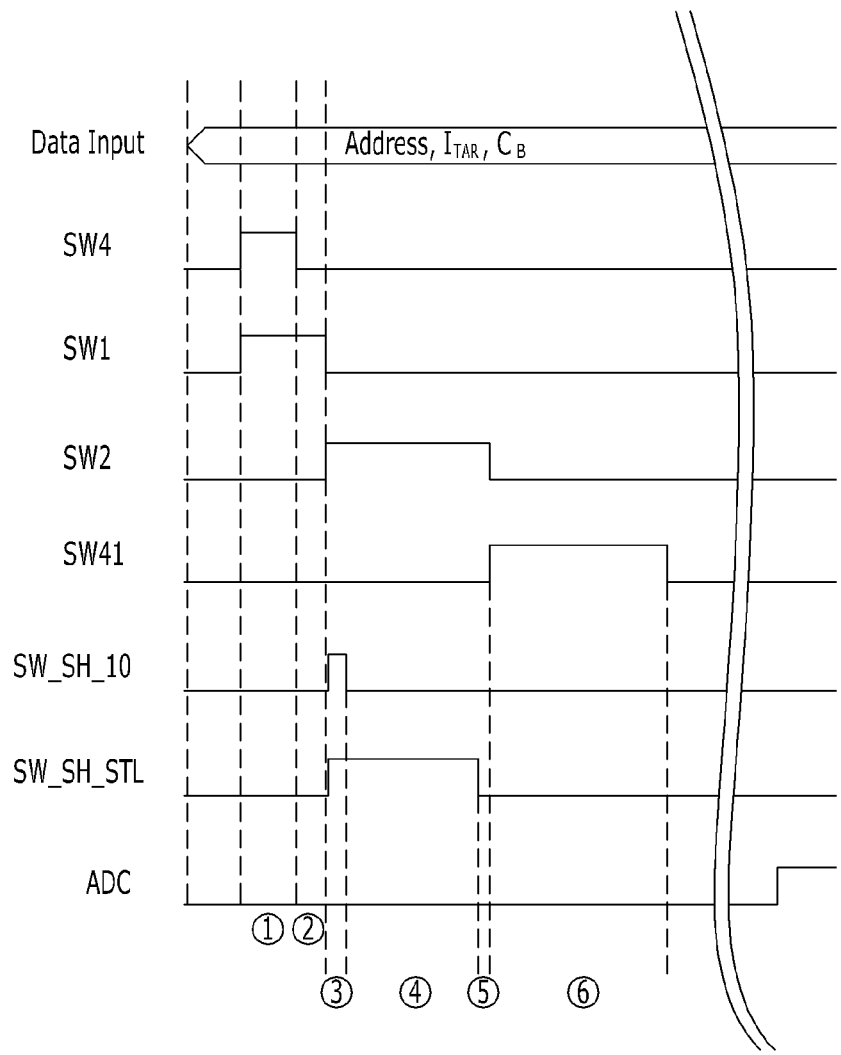
FIG. 10 illustrates a switching timing diagram of the units included in the driver for a semiconductor memory during the calibration mode in accordance with another embodiment of the present invention.

FIG. 10 is a switching timing diagram of units included in the driver for a semiconductor memory during the calibration mode in accordance with an embodiment of the present invention.

First, when current data and a memory cell address are inputted to the selection controller 630, the discharge switch SW4 connected to an input terminal of the test memory cell 616 is turned on during a predetermined time so as to discharge electric charges existing in the test memory cell 616. At the same time, the first switch SW1 is turned on to pass a current toward the ground terminal from the current supply unit 640 so that the current supply unit 640 is ready for subsequent operations (period $\hat{1}$). As soon as the first switch SW1 is turned off, the second switch SW2 is turned on to pass the bucket charge current $I_{BUCKET}$ and the target charge current $I_{TARGET}$ to the test memory cell 616. Then, the switch SW_SH_10 of the first sample and hold unit 624 is turned on during 10 ns after the calibration mode is started (period $\hat{3}$). After the switch SW_SH_10 is turned off, the switch SW_SH_STL of the second sample and hold unit 628 remains turned on until 90 ns after the calibration mode is started, and a current magnitude at the corresponding time period is measured (period $\hat{4}$). After the period $\hat{4}$ during which the switch SW_SH_10 of the first sample and hold unit 624 is turned off and the switch SW_SH_STL of the second sample and hold unit 628 is turned on, the second switch SW2 remains turned on during a predetermined time (period $\hat{5}$), and then is turned off. Subsequently, the discharge switch SW41 is turned on during a predetermined time (period $\hat{6}$) to lower the increased voltage of the second node N2.

Figure 11:
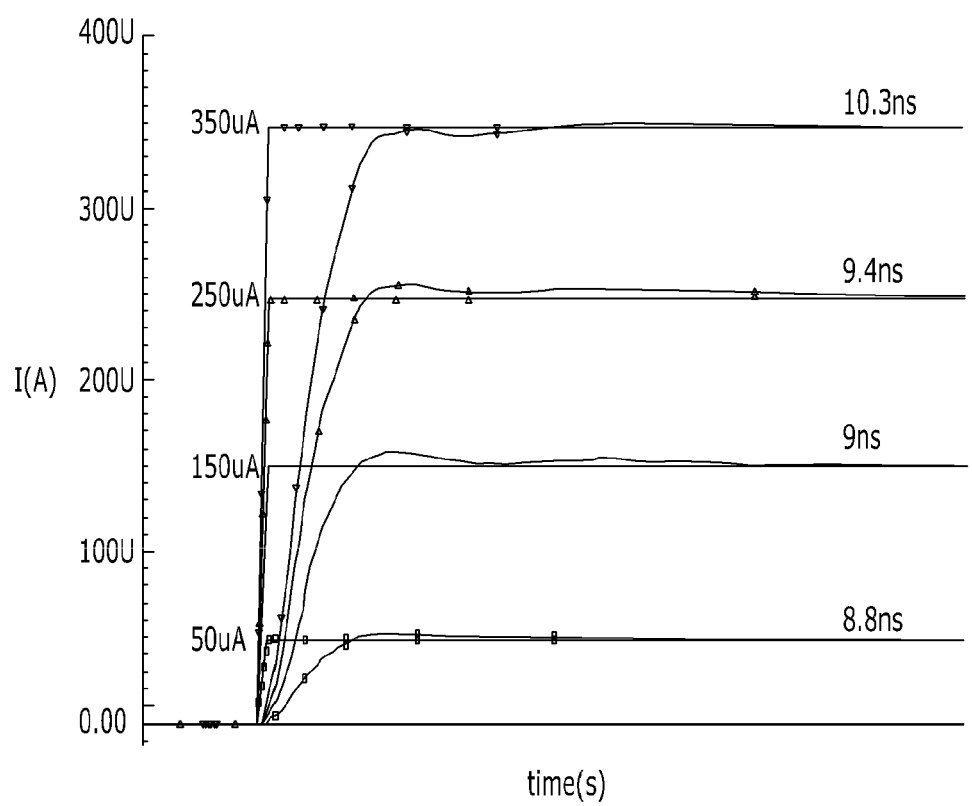
FIG. 11 illustrates voltage response waveforms corresponding to various levels of currents flowing to a memory cell in accordance with another embodiment of the present invention.

FIG. 11 illustrates current response waveforms in accordance with the embodiment of the present invention. Referring to FIG. 11, it can be seen that even when various levels of currents are applied to the memory cell, the driver may rapidly reach a steady state.

In accordance with the embodiments of the present invention, when data is written into a resistive memory such as a memory cell of PRAM or ReRAM according to the current driving method, the previously-calibrated bucket charge current is applied to each memory cell to provide a stable pre-charge voltage. Accordingly, not only the writing speed may be improved, but also an overshoot in the pre-charge voltage may be prevented. Furthermore, by using the current mirror unit 740 capable of amplifying a current into the memory cell, the required capacitance of the charge bucket 710 may be reduced.

Although various embodiments have been described for illustrative purposes, it will be apparent to those skilled in the art that various changes and modifications may be made without departing from the spirit and scope of the invention as defined in the following claims.

What is claimed is:

1. A driver for semiconductor memory, comprising:
   a storage unit configured to match and store a memory cell address and bucket charge current data corresponding to the memory cell address;
   a selection controller configured to receive the memory cell address and target charge current data, and output a bucket charge current select signal and a target charge current select signal corresponding to the bucket charge current data and the target charge current data, respectively, by referring to the storage unit;
   a current supply unit configured to supply a bucket charge current and a target charge current in response to the bucket charge current select signal and the target charge current select signal, respectively; and
   a bucket charge current setting unit configured to set the bucket charge current data stored in the storage unit with respect to each memory cell address.

2. The driver of claim 1, wherein the bucket charge current setting unit comprises:
   a sampling unit configured to sample one or more values associated with a parasitic component within a memory cell corresponding to the memory cell address by using a test memory cell corresponding to the memory cell; and
   an error calibrator configured to calibrate the bucket charge current,
   wherein the bucket charge current is calibrated such that an error rate based on the sampled values of the parasitic component within the memory cell falls within a permissible error range.

3. The driver of claim 2, wherein the test cell comprises one or more of parasitic components which are equal or similar to those of the corresponding memory cell.

4. The driver of claim 3, wherein the error calibrator calibrates the bucket charge current by comparing a precharge voltage of the test memory cell when the sum of the bucket charge current and the target charge current flows into the test memory cell to a normal voltage of the test memory cell when the target charge current flows into the test memory cell.

5. The driver of claim 1, wherein the current supply unit comprises:
   a charge bucket configured to provide a different capacitance value in response to the bucket charge current select signal;
   a bias unit configured to supply a predetermined current, the bias unit comprising a current source coupled between a power supply voltage and a ground terminal;
   a negative feedback unit configured to output a negative feedback voltage according to a voltage obtained by coupling an output voltage of the charge bucket and an output voltage of the bias unit;
   a current mirror unit configured to generate an output current using the negative feedback voltage and the target charge current select signal; and
   a reset voltage generation unit configured to generate a reset voltage for resetting the current mirror unit after the output current is provided to the memory cell.

6. The driver of claim 5, wherein the charge bucket comprises:
   a plurality of capacitors coupled in parallel to each other, one or more of the plurality of capacitors being selectively switched in response to the bucket charge current select signal;
   a reset switch coupled between the plurality of capacitors and the ground terminal and configured to reset the selectively switched capacitors; and
   a bucket current switch coupled between the plurality of capacitors and the ground terminal and configured to discharge the selectively switched capacitors.

7. The driver of claim 5, wherein the current mirror unit comprises:
   a power supply voltage controller configured to control the power supply voltage using the negative feedback voltage;
   a reference current provider coupled between the power supply voltage controller and the negative feedback unit and configured to pass a reference current; and
   a mirrored current generator configured to selectively switch one or more of a plurality of current-mirror switching elements in response to the target charge current select signal so as to couple the memory cell to the power supply voltage and generate the output current, the plurality of current-mirror switching elements being coupled in parallel to each other.

8. The driver of claim 7, wherein the reset voltage generation unit comprises:
a discharge unit comprising a discharge switch configured to decrease a control terminal voltage of the current-mirror switching elements to a predetermined first level; and
a charge unit comprising a charge switch configured to increase the control terminal voltage of the current-mirror switching elements to a predetermined second level.

9. A method of a driver for semiconductor memory, comprising:
selecting bucket charge current data based on an inputted memory cell address and target charge current data;
outputting a target charge current select signal and a bucket charge current select signal corresponding to the target charge current data and the bucket charge current data, respectively;
providing a bucket charge current to a memory cell corresponding to the memory cell address so as to pre-charge the memory cell corresponding to the memory cell address in response to the bucket charge current select signal;
providing a target charge current to the memory cell in response to the target charge current select signal; and
calibrating the bucket charge current data to pre-charge a parasitic component within the memory cell corresponding to the memory cell address.

10. The method of claim 9, wherein calibrating the bucket charge current comprises sampling values associated with the parasitic component within the memory cell corresponding to the memory cell address.

11. The method of claim 10, wherein sampling the values associated with the parasitic component comprises using a test cell corresponding to the memory cell.

12. The method of claim 11, wherein the test cell comprises one or more of parasitic components which are equal or similar to those of the corresponding memory cell.

13. The method of claim 11, wherein calibrating the bucket charge current further comprises comparing a pre-charge voltage of the test cell when the sum of the bucket charge current and the target charge current flows into the test cell to a normal voltage of the test cell when the target charge current flows into the test cell.

14. The method of claim 9, wherein providing the bucket charge current comprises selectively switching a plurality of capacitors in response to the bucket charge current select signal.

15. The method of claim 9, wherein providing the target charge current comprises outputting an output current by selectively switching one or more of a plurality of current-mirror switching elements in response to the target charge current select signal, the plurality of current-mirror switching elements coupled in parallel to each other.

16. A driver for semiconductor memory, comprising:
a storage unit configured to store a bucket charge current value;
a selection controller configured to read the bucket charge current value stored in the storage unit based on an inputted memory cell address and a target charge current value, and output a bucket charge current select signal and a target charge current select signal corresponding to the bucket charge current value the target charge current value, respectively;
a current mirror unit; and
a current supply unit configured to supply a bucket charge current and a target charge current in response to the bucket charge current select signal and a target charge current select signal by using the current mirror unit.

17. The driver of claim 16, wherein the current supply unit comprises:
a charge bucket configured to selectively switch one or more of a plurality of capacitors in response to the bucket charge current select signal, the plurality of capacitors coupled in parallel to each other;
a bias unit configured to apply a predetermined current, the bias unit comprising a current source coupled between a power supply voltage and a ground terminal;
a negative feedback unit configured to output a negative feedback voltage according to a voltage obtained by coupling an output voltage of the charge bucket and an output voltage of the bias unit;
the current mirror unit configured to generate an output current using the negative feedback voltage and the target charge current select signal; and
a reset voltage generation unit configured to generate a reset voltage so as to reset the current mirror unit after the output current is provided to a memory cell.

18. The driver of claim 17, wherein the current mirror unit comprises:
a power supply voltage controller configured to control the power supply voltage using the negative feedback voltage;
a reference current provider coupled between the power supply voltage controller and the negative feedback unit and configured to pass a reference current; and
a mirrored current generator configured to selectively switch one or more of a plurality of current-mirror switching elements in response to the target charge current select signal so as to couple the memory cell to the power supply voltage and generate the output current, the plurality of current-mirror switching elements being coupled in parallel to each other.

* * * * *